US007006313B2

(12) United States Patent  (10) Patent No.: US 7,006,313 B2
Ngo  (45) Date of Patent: Feb. 28, 2006

(54) CIRCUIT AND METHOD TO MATCH COMMON MODE FLEX IMPEDANCE AND TO ACHIEVE SYMMETRICAL SWITCHING VOLTAGE OUTPUTS OF WRITE DRIVER

(75) Inventor: Tuan V. Ngo, Eden Prairie, MN (US)

(73) Assignee: Texas Instruments Incorporated, Dallas, TX (US)

( * ) Notice: Subject to any disclaimer, the term of this patent is extended or adjusted under 35 U.S.C. 154(b) by 353 days.

(21) Appl. No.: 10/179,561

(22) Filed: Jun. 25, 2002

(65) Prior Publication Data

US 2003/0234996 A1  Dec. 25, 2003

(51) Int. Cl.
G11B 5/09  (2006.01)
(52) U.S. Cl. .................................... 360/46
(58) Field of Classification Search ............ 360/66, 360/67, 60, 68, 51; 324/210, 212
See application file for complete search history.

(56) References Cited

U.S. PATENT DOCUMENTS

| 4,879,610 | A | * | 11/1989 | Jove et al. ............ 360/67 |
| 4,964,107 | A | * | 10/1990 | Galbraith et al. ........ 360/51 |
| 5,079,448 | A | | 1/1992 | Matsumoto |
| 5,293,278 | A | | 3/1994 | Pahr |
| 5,296,975 | A | * | 3/1994 | Contreras et al. ........ 360/46 |
| 5,386,328 | A | * | 1/1995 | Chiou et al. ............ 360/68 |
| 5,668,676 | A | | 9/1997 | Voorman et al. ......... 360/46 |
| 5,790,336 | A | | 8/1998 | Voorman et al. ......... 360/68 |
| 5,834,965 | A | | 11/1998 | LeClerc .................. 327/423 |
| 5,841,603 | A | | 11/1998 | Ramalho et al. .......... 360/68 |
| 5,896,248 | A | * | 4/1999 | Hanrahan et al. ........ 360/234.5 |
| 6,236,247 | B1 | | 5/2001 | Ngo |

(Continued)

FOREIGN PATENT DOCUMENTS

WO  WO98/ 10420  3/1998

(Continued)

OTHER PUBLICATIONS

Article: "A 1Gb/s Read/Write—Preamble for Hard-Disk Drive Applications" 2001 IEEE International Solid-State Circuits Conference, Session 12, Signal Processing for Storage and Coding, pp. 150-151, 188-189 (Hugo Veenstra; Jan Mulder; Luan Le; Giuseppe Grillo).

*Primary Examiner*—David Hudspeth
*Assistant Examiner*—Glenda P. Rodriguez
(74) *Attorney, Agent, or Firm*—W. Daniel Swayze, Jr.; W. James Brady; Frederick J. Telecky, Jr.

(57) ABSTRACT

A write driver 100, 200, 300 is implemented to provide near-ground common mode output voltages to produce a more symmetrical head voltage swing (i.e. ±0.4V from ground to ±5V supply voltages). These features help to reduce the effects of common mode impedance associated with the interconnection to the disk drive head to improve overall performance. Lower jitter at high data rates can be achieved when compared to prior art techniques for implementing current mode write drivers. Further, the matched impedance between the write driver 100 and the interconnection 106 eliminates unwanted reflections. ECL level voltage swings (200–500 mV) have replaced more conventional CMOS level voltage swings (5V) to further reduce overall power dissipation associated with the write driver. The small ECL level switching further maintains constant power dissipation with changes in operating frequency and results in less NTLS effects due to quieter supplies.

10 Claims, 3 Drawing Sheets

U.S. PATENT DOCUMENTS

| | | | |
|---|---|---|---|
| 6,246,533 B1 * | 6/2001 | Davis et al. | 360/68 |
| 6,356,113 B1 | 3/2002 | Contreras et al. | 326/82 |
| 6,512,646 B1 * | 1/2003 | Leighton et al. | 360/46 |
| 6,545,514 B1 * | 4/2003 | Barrow | 360/46 |

FOREIGN PATENT DOCUMENTS

| | | |
|---|---|---|
| WO | WO99/ 60562 | 11/1999 |
| WO | WO 00/79521 A1 | 12/2000 |

* cited by examiner

CIRCUIT AND METHOD TO MATCH COMMON MODE FLEX IMPEDANCE AND TO ACHIEVE SYMMETRICAL SWITCHING VOLTAGE OUTPUTS OF WRITE DRIVER

BACKGROUND OF THE INVENTION

1. Field of the Invention

This invention relates generally to write drivers, and more particularly, to a technique for matching both the differential and common mode impedance of a write driver to a line (i.e. flex/interconnect) impedance.

2. Description of the Prior Art

When a write driver in a disk drive system is used to write data into a thin film transducer, a flex/interconnect is commonly used to connect the output of the write driver to the thin film transducer. When writing at high data rates (e.g. 1–2 Gb/s), the mismatch of the differential and common mode impedance between the write driver's output and the flex/interconnect input impedance causes severe signal reflections. These differential and common mode reflections degrade the integrity of the signal written onto the thin film transducer, which in turn limits the data rate of the disk drive system.

In view of the foregoing, it would be desirable and advantageous in the write driver art to provide a technique for matching both the differential and common mode impedance of a write driver to a flex/interconnect impedance to achieve minimal signal reflections and permit very high data rates associated with write operations.

SUMMARY OF THE INVENTION

The present invention is directed to a system and method for matching both the differential and common mode impedance of a disk drive system write driver to a flex/interconnect impedance to achieve minimal signal reflections and permit very high data rates associated with write operations.

In one aspect of the invention, a system and method for matching both the differential and common mode impedance of a disk drive system write driver to a flex/interconnect impedance is implemented to provide a symmetrical output voltage swing that centers around ground.

In another aspect of the invention, a system and method for matching both the differential and common mode impedance of a disk drive system write driver to a flex/interconnect impedance is implemented to achieve low jitter and low interference in the disk drive system.

BRIEF DESCRIPTION OF THE DRAWINGS

Other aspects, features and advantages of the present invention will be readily appreciated as the invention becomes better understood by reference to the following detailed description when considered in connection with the accompanying drawing figures wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

As stated herein before, when a write driver in a disk drive system is used to write data into a thin film transducer, a flex/interconnect is commonly used to connect the output of the write driver to the thin film transducer. When writing at high data rates (e.g. 1–2 Gb/s), the mismatch of the differential and common mode impedance between the write driver's output and the flex/interconnect input impedance causes severe signal reflections. These differential and common mode reflections degrade the integrity of the signal written onto the thin film transducer, which in turn limits the data rate of the disk drive system.

Figure 1:
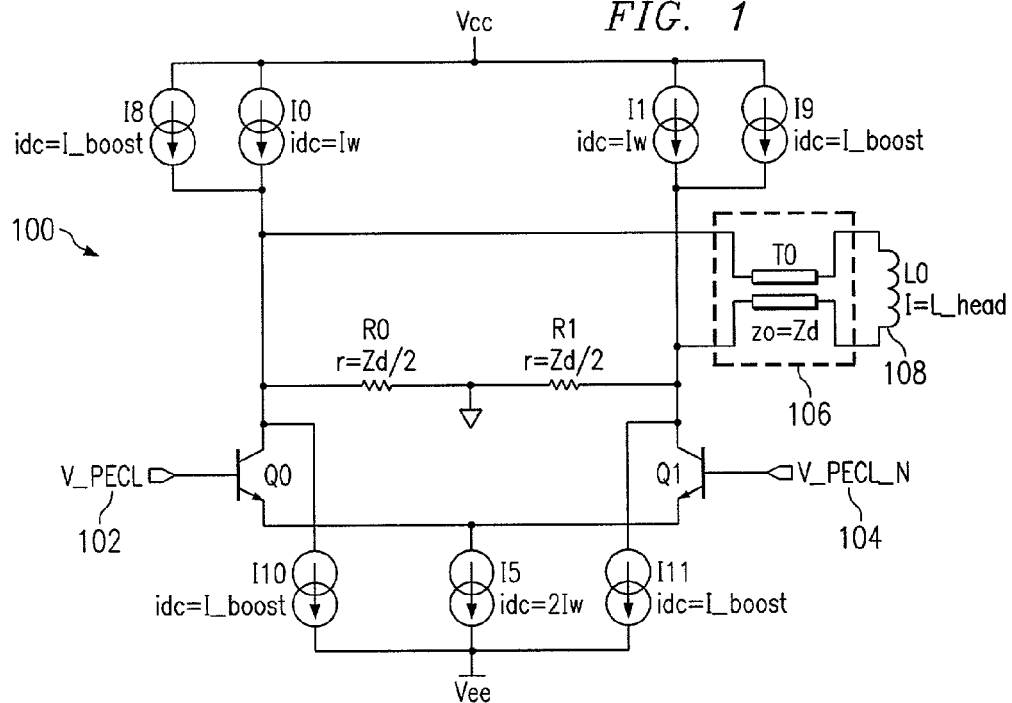
FIG. 1 is a schematic diagram illustrating a current mode impedance matched write driver for an inductive head associated with a disk drive system using PECL logic according to one embodiment of the present invention.

Looking now at FIG. 1, a schematic diagram illustrates a current mode impedance matched write driver (current switch) 100 for an inductive head (thin film transducer) 108 associated with a disk drive system using PECL logic according to one embodiment of the present invention. The differential output impedance of the current-mode write driver 100 is matched to the differential impedance of the interconnection 106, which is also connected to the thin film head for writing data. The write driver 100 and its associated pre-driver can be seen to use Pseudo-ECL logic (200–300 mV) 102, 104 for switching, thus reducing sensitivity to jitter and output data pattern dependency (i.e. creates less power supply coupling noise), as well as reduced power dissipation at high data rates.

Figure 2:
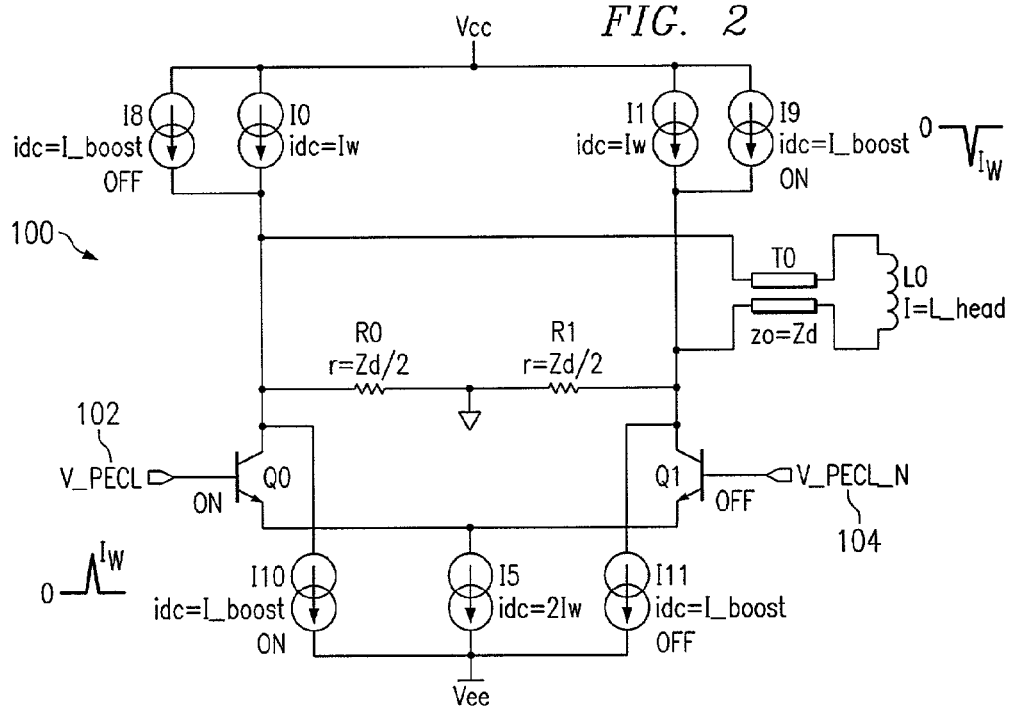
FIG. 2 is a schematic diagram illustrating the boosting operation of the write driver shown in FIG. 1.

With continued reference to FIG. 1, only a single pair of transistors are switched as contrasted with using a conventional H-bridge current switch more commonly used by those skilled in the art. NPN transistors Q0 and Q1 are switched on and off by the ECL level inputs V_PECL 102 and V_PECL_N 104. The current generated by current source I5 is twice the write current (Iw). The upper current sources I0 and I1 each generate a current equal to the write current (Iw). When ECL level input V_PECL 102 is high, as shown in FIG. 2 for example, NPN transistor Q0 turns on and conducts a current of 2×Iw. One Iw will pass through the head and is sunk by I1, while the other Iw is sunk by I0. Switched current sources I8 and I9 provide additional currents to boost up the head voltages. Switched current sources I10 and I11 similarly provide the boost currents for the down side. These boost currents are switched from 0 to Iw in order to provide current pulses to generate more overshoot (enumerated as 402 in FIG. 5) and help reduce the voltage slew rate, i.e. increase the rise time of the head voltage pulses 500 depicted in FIG. 6. Resistors R0 and R1 are set to be equal to Zd/2, where Zd is the differential impedance of the external interconnection 106. Resistors R0 and R1 can be seen to be connected from the head side of the write driver 100 output to ground to produce near ground common mode output voltages. Together FIGS. 1 and 2 illustrate the boosting operation of the write driver 100.

Figure 3:
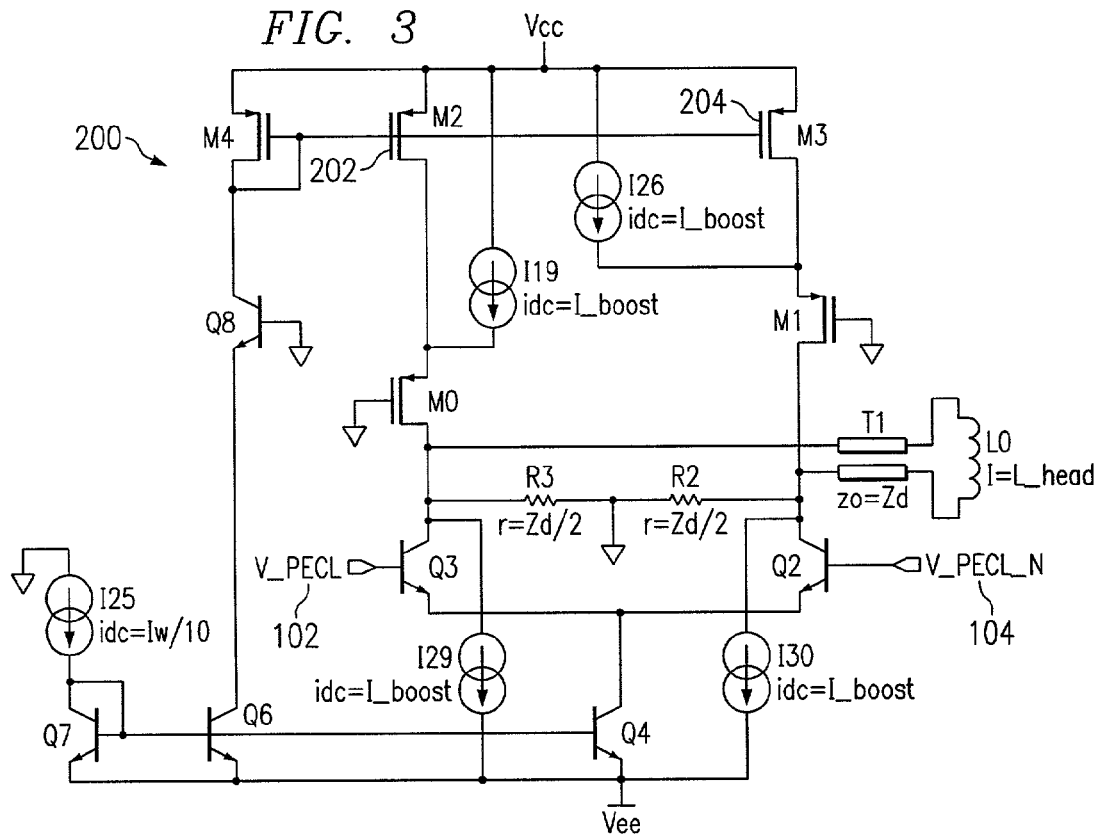
FIG. 3 is a schematic diagram illustrating implementation of a current-mode impedance matched write driver using a BiCMOS process without vertical PNP transistors according to one embodiment of the present invention.

FIG. 3 is a schematic diagram illustrating the implementation of a current-mode impedance matched write driver 200 using a BiCMOS process without vertical PNP transistors according to another embodiment of the present invention. PMOS devices 202 and 204 are used to implement the upper current sources equivalent to I0 and I1 respectively. Transistors M0 and M1 are simply used to prevent breakdown of the MOS channels.

Figure 4:
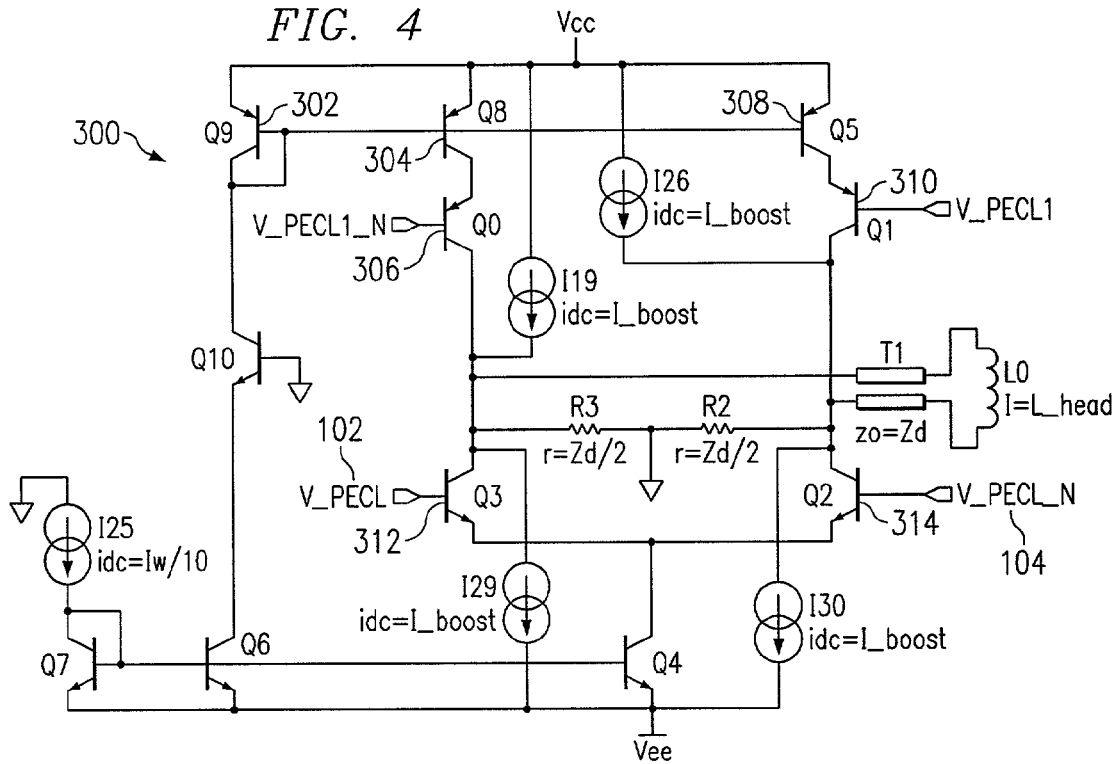
FIG. 4 is a schematic diagram illustrating implementation of a current mode impedance matched write driver using a BIPOLAR process with high-speed vertical PNP transistors according to one embodiment of the present invention.

FIG. 4 is a schematic diagram illustrating implementation of a current mode impedance matched write driver 300 using a BIPOLAR process with high-speed vertical PNP transistors 302–310 according to yet another embodiment of the present invention. This scheme was found by the present inventors to conserve power dissipation since both the upper and lower transistor pairs, 306/310 and 312/314 respectively, are switched. Only a 1×Iw write current is therefore necessary to implement both the upper and lower current sources.

Figure 5:
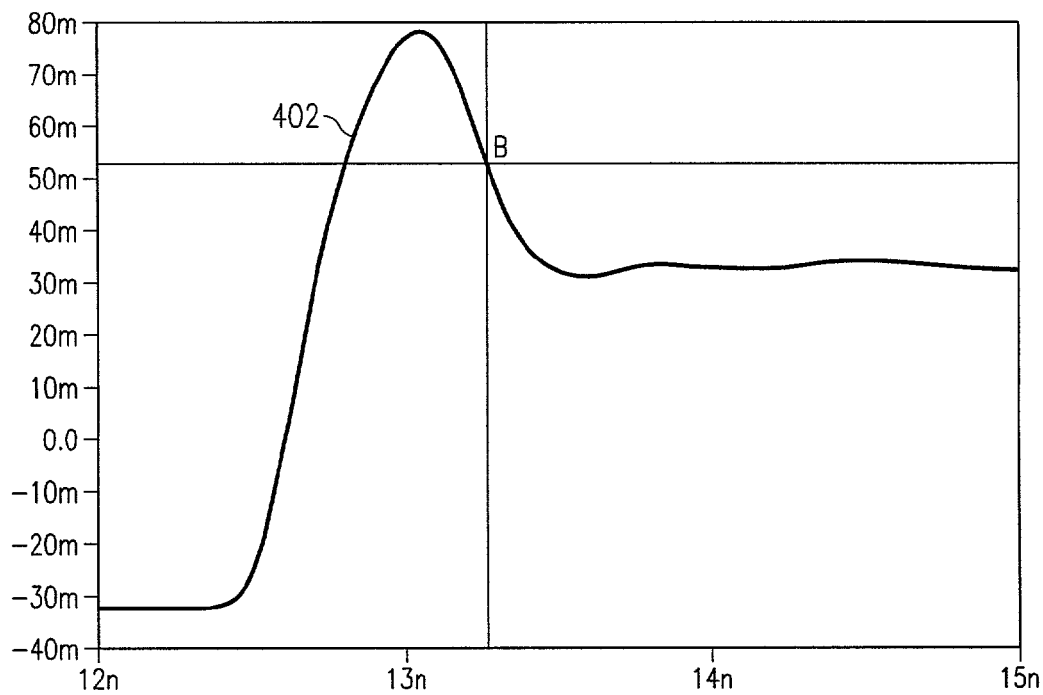
FIG. 5 is a typical disk drive head current pulse waveform produced by the write driver shown in FIG. 1 illustrating a desired overshoot to reduce the voltage slew rate associated with the disk drive head (thin film transducer) voltage.
Figure 6:
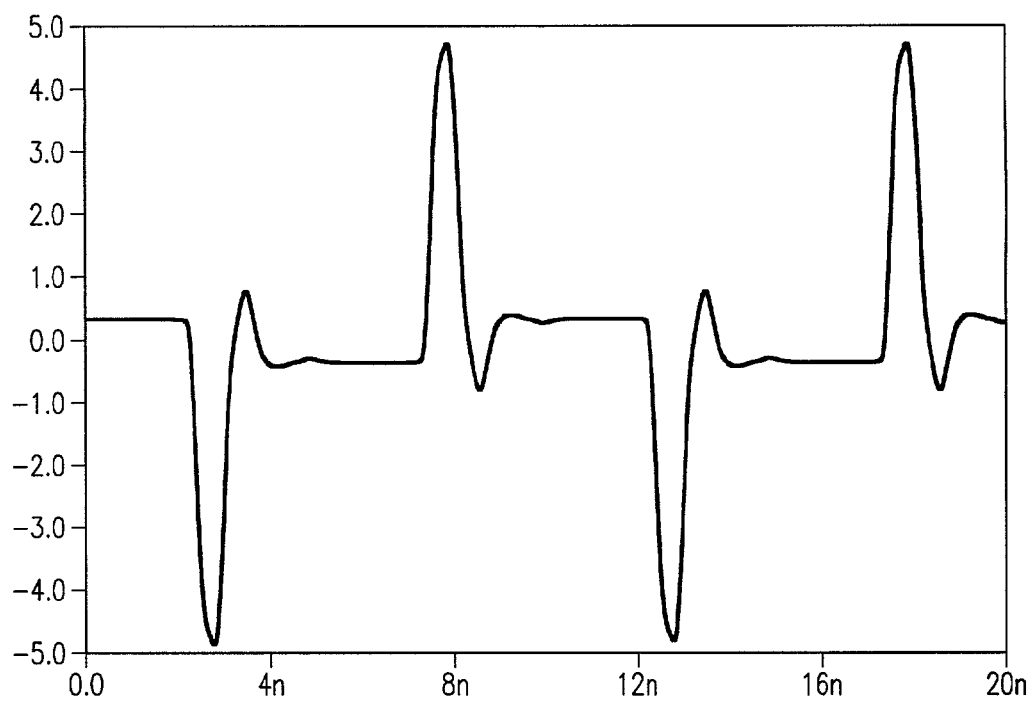
FIG. 6 is a typical disk drive head voltage pulse waveform produced by the write driver shown in FIG. 1 illustrating a desired near-ground common mode output voltage to reduce the effect of the common mode impedance associated with the interconnection between the write driver and the disk drive head (thin film transducer).

FIG. 5 is a typical disk drive head current pulse waveform 400 produced by the write driver shown in FIG. 1 illustrating a desired overshoot 402 to reduce the voltage slew rate associated with the disk drive head (thin film transducer) voltage 500 shown in FIG. 6.

FIG. 6 is a typical disk drive head voltage pulse waveform 500 produced by the write driver shown in FIG. 1 illustrating a desired near-ground common mode output voltage to reduce the effect of the common mode impedance associated with the interconnection between the write driver and the disk drive head (thin film transducer).

In summary explanation, a write driver 100, 200, 300 is implemented to provide near-ground common mode output voltages to produce a more symmetrical head voltage swing (i.e. ±0.4V from ground to ±5V supply voltages as shown in FIG. 6). These features help to reduce the effects of common mode impedance associated with the interconnection 106 to the disk drive head 108 to improve overall performance. Lower jitter at high data rates can be achieved when compared to prior art techniques for implementing current mode write drivers. Further, the matched impedance between the write driver 100 and the interconnection 106 eliminates unwanted reflections. ECL level voltage swings (200–500 mV) have replaced more conventional CMOS level voltage swings (5V) to further reduce overall power dissipation associated with the write driver. The small ECL level switching further maintains constant power dissipation with changes in operating frequency and results in less NTLS effects due to quieter supplies.

In view of the above, it can be seen the present invention presents a significant advancement in the art of inductive head write drivers. Further, this invention has been described in considerable detail in order to provide those skilled in the disk drive art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A disk drive write driver comprising:
   a current switch having a differential output impedance configured to match the differential input impedance of a predetermined interconnection coupling the current switch to an inductive head, and further having a common mode output impedance configured to match the common mode input impedance of the predetermined interconnection, wherein the current switch is operational to switch in response to Pseudo-ECL logic input signals such that the current switch generates near ground common mode output voltages when writing to the inductive head,
   wherein the current switch comprises a plurality of bipolar NPN transistors and a plurality of PMOS transistors, and further wherein the current switch is devoid of bipolar PNP transistors and is further devoid of NMOS devices.

2. The disk drive write driver according to claim 1 wherein the predetermined interconnection comprises a flex circuit.

3. The disk drive write driver according to claim 1 wherein the inductive head comprises a thin film transducer.

4. The disk drive write driver according to claim 1 wherein the current switch is devoid of transistors other than a single pair of bipolar NPN transistors that switch on and off in response to the Pseudo-ECL logic input signals.

5. The disk drive write driver according to claim 1 wherein the current switch further comprises a plurality of switched-current sources operational to boost disk drive head currents during switching such that the slew rates associated with head voltages generated by the current switch are reduced to a lower level than that achievable without the plurality of switched-current sources.

6. The disk drive write driver according to claim 1 wherein only a single pair of bipolar NPN transistors selected from the plurality of bipolar NPN transistors are operational to switch on and off in response to the Pseudo-ECl logic input signals.

7. A disk drive write driver comprising:
   a current switch having a differential output impedance configured to match the differential input impedance of a predetermined interconnection coupling the current switch to an inductive head, and further having a common mode output impedance configured to match the common mode input impedance of the predetermined interconnection, wherein the current switch is operational to switch in response to Pseudo-ECL logic input signals such that the current switch generates near ground common mode output voltages when writing to the inductive head,
   wherein the current switch is devoid of transistors other than a plurality of bipolar NPN transistors and a plurality of high-speed vertical PNP transistors, wherein only a single pair of bipolar NPN transistors and only a single pair of high-speed vertical PNP transistors are operational to switch on and off in response to the Pseudo-ECL logic input signals.

8. A disk drive write driver comprising:
   a single pair of bipolar NPN transistors; and
   a plurality of current sources, wherein the single pair of bipolar NPN transistors are configured to switch on and off in response to Pseudo-ECL logic input signals such that the plurality of current sources are switched on and off in a manner sufficient to cause the disk drive write driver to generate near ground common mode output voltages when the disk drive write driver is coupled to an inductive head, wherein the single pair of bipolar NPN transistors and the plurality of current sources comprise a current switch configured with a differential output impedance to match the differential input impedance of a desired interconnection when the desired interconnection couples the current switch to an inductive head, and further wherein the current switch is configured with a common mode output impedance to match the common mode input impedance of the desired interconnection when the desired interconnection couples the current switch to an inductive head.

9. The disk drive write driver according to claim 8 wherein the disk drive write driver is devoid of PNP transistors.

10. The disk drive write driver according to claim 8 wherein the disk drive write driver is devoid of MOS transistors.

* * * * *